(12) United States Patent
Chu-Kung et al.

(10) Patent No.: US 11,195,924 B2
(45) Date of Patent: Dec. 7, 2021

(54) BROKEN BANDGAP CONTACT

(71) Applicant: Intel Corporation, Santa Clara, CA (US)

(72) Inventors: Benjamin Chu-Kung, Portland, OR (US); Van H. Le, Portland, OR (US); Jack T. Kavalieros, Portland, OR (US); Willy Rachmady, Beaverton, OR (US); Matthew V. Metz, Portland, OR (US); Ashish Agrawal, Hillsboro, OR (US); Seung Hoon Sung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/094,151

(22) PCT Filed: Jun. 27, 2016

(86) PCT No.: PCT/US2016/039632
§ 371 (c)(1),
(2) Date: Oct. 16, 2018

(87) PCT Pub. No.: WO2018/004521
PCT Pub. Date: Jan. 4, 2018

(65) Prior Publication Data
US 2019/0140061 A1 May 9, 2019

(51) Int. Cl.
*H01L 29/417* (2006.01)
*H01L 29/45* (2006.01)
(Continued)

(52) U.S. Cl.
CPC .. *H01L 29/41791* (2013.01); *H01L 21/28525* (2013.01); *H01L 21/76895* (2013.01);
(Continued)

(58) Field of Classification Search
CPC ............. H01L 29/0603; H01L 29/0646; H01L 29/0684; H01L 29/0688; H01L 29/1608;
(Continued)

(56) References Cited

U.S. PATENT DOCUMENTS 5,021,863 A * 6/1991 Yokoyama ............ H01L 29/205
257/585
5,831,337 A * 11/1998 Sato ........................ H01L 24/13
257/780

(Continued)

OTHER PUBLICATIONS

Song et al. "Metal-oxide broken-gap tunnel junction of copper indium gallium diselenide tandem solar cells", Solar Energy Materials & Solar Cells 133 (2015) 133-142 (Year: 2015).*

(Continued)

*Primary Examiner* — Sonya McCall-Shepard
(74) *Attorney, Agent, or Firm* — Schwabe, Williamson & Wyatt, P.C.

(57) ABSTRACT

An interlayer film is deposited on a device layer on a substrate. A contact layer is deposited on the interlayer film. The interlayer film has a broken bandgap alignment to the device layer to reduce a contact resistance of the contact layer to the device layer.

10 Claims, 7 Drawing Sheets

(51) Int. Cl.
  *H01L 29/06* (2006.01)
  *H01L 29/08* (2006.01)
  *H01L 21/285* (2006.01)
  *H01L 21/768* (2006.01)
  *H01L 29/78* (2006.01)

(52) U.S. Cl.
  CPC ...... *H01L 29/0619* (2013.01); *H01L 29/0646* (2013.01); *H01L 29/086* (2013.01); *H01L 29/0865* (2013.01); *H01L 29/0878* (2013.01); *H01L 29/0882* (2013.01); *H01L 29/45* (2013.01); *H01L 29/785* (2013.01)

(58) Field of Classification Search
  CPC . H01L 29/161; H01L 29/41791; H01L 29/43; H01L 29/45–458; H01L 21/02439–0245; H01L 21/02494–02507; H01L 21/02518–02532; H01L 29/66151; H01L 29/66219; H01L 29/88–882; H01L 29/862; H01L 2924/12032; H01L 29/66143; H01L 29/66212; H01L 29/872; H01L 27/0766; H01L 51/0579; H01L 29/06; H01L 29/0615; H01L 26/0642; H01L 29/0843; H01L 29/0847; H01L 29/0852; H01L 29/0856; H01L 29/086; H01L 29/0865; H01L 29/0873; H01L 29/0878; H01L 29/0882; H01L 29/0895
  See application file for complete search history.

(56) References Cited

U.S. PATENT DOCUMENTS

| | | | |
|---|---|---|---|
| 6,526,082 B1 | 2/2003 | Corzine et al. | |
| 7,928,425 B2* | 4/2011 | Rao | H01L 29/154 257/20 |
| 2003/0025113 A1 | 2/2003 | Van De Walle | |
| 2009/0065803 A1 | 3/2009 | Wicks | |
| 2009/0272965 A1* | 11/2009 | Rachmady | H01L 21/02205 257/24 |
| 2010/0123198 A1* | 5/2010 | Kim | H01L 21/76804 257/377 |
| 2011/0057270 A1* | 3/2011 | Nishikawa | H01L 29/6659 257/408 |
| 2011/0309410 A1 | 12/2011 | Maimon | |
| 2014/0117312 A1 | 5/2014 | Farmer et al. | |
| 2014/0175567 A1 | 6/2014 | Barabash et al. | |
| 2015/0061028 A1* | 3/2015 | He | H01L 21/823814 257/369 |
| 2015/0206942 A1* | 7/2015 | Glass | H01L 29/785 257/335 |
| 2017/0213889 A1* | 7/2017 | Gluschenkov | H01L 29/0847 |

OTHER PUBLICATIONS

Giampietri et al. "Band Alignment at Heteroepitaxial Perovskite Oxide Interfaces. Experiments, Methods and Perspectives", Advanced Materials Interfaces, 2017, 4, 1700144 (1-13) (Year: 2017).*
Nishimura et al., "Evidence for strong Fermi-level pinning due to metal-induced gap states at metal/germanium interface", Applied Physics Letters, vol. 91, 123123 (2007) (Year: 2007).*
International Search Report and Written Opinion for International Patent Application No. PCT/US2016/039632 dated, Mar. 29, 2017, 13 pgs.
International Preliminary Report on Patentability for International Patent Application No. PCT/US2016/039632 dated, Jan. 10, 2019, 10 pgs.
Office Action from Taiwan Patent Application No. 106116141, dated May 7, 2021, 17 pgs.
Office Action from Taiwan Patent Application No. 106116141, dated Nov. 4, 2020, 18 pgs.

* cited by examiner

BROKEN BANDGAP CONTACT

CROSS-REFERENCE TO RELATED APPLICATION

This patent application is a U.S. National Phase Application under 35 U.S.C. § 371 of International Application No. PCT/US2016/039632, filed Jun. 27, 2016, entitled "BROKEN BANDGAP CONTACT," which designates the United States of America, the entire disclosure of which is hereby incorporated by reference in its entirety and for all purposes.

FIELD

Embodiments as described herein relate to a field of electronic device manufacturing, and in particular, to electronic device contacts.

BACKGROUND

Typically, manufacturing of electronic devices e.g., transistors, diodes, resistors, capacitors, and other passive and active electronic devices involves forming contacts to a semiconductor material to conduct an electrical charge in both directions between the device and an external circuitry. Typically, forming the contacts to semiconductors involves depositing thin metal films of a carefully chosen composition, possibly followed by annealing to alter the semiconductor-metal bond.

Currently, it is practically impossible to obtain low resistance ohmic contacts to an n-type germanium. Currently, contacts to an n-type germanium have the resistance that is substantially higher than the contacts to silicon. The high resistance contacts prevent the flow of charge between the device and the external circuitry. The high resistance contacts impact performance and reliability of the devices.

BRIEF DESCRIPTION OF THE DRAWINGS

Embodiments of the invention may be best understood by referring to the following description and accompanying drawings that are used to illustrate embodiments of the invention. In the drawings.

DETAILED DESCRIPTION

Figure 1A:
FIG. 1A is a cross-sectional view of an electronic device structure to provide a broken bandgap contact according to one embodiment.

Methods and apparatuses to provide broken bandgap tunneling contacts are described. In one embodiment, an interlayer film is deposited on a device layer on a substrate. A contact layer is deposited on the interlayer film. The interlayer film has a broken bandgap alignment to the device layer, and a Fermi level of the contact layer pins to a valence band of the interlayer to reduce a contact resistance of the contact layer to the device layer. In one embodiment, the broken bandgap alignment indicates that at least the valence band energy of the interlayer film is greater than or equal to the conduction band energy of the device layer.

Generally, an electronic band structure of a material describes ranges of energies that an electron within the material may have (e.g., a conduction band, a valence band) and ranges of energies that the electron may not have (e.g., a bandgap). The valence band and conduction band refer to the energy bands that determine an electrical conductivity of the semiconductor material. The valence band refers to the highest range of electron energies in which electrons are normally present at absolute zero temperature and the conduction band refers to the lowest range of vacant electronic states. A Fermi level refers to an electrochemical potential for electrons inside a material. Typically, in metals the Fermi level lies inside at least one energy band. A Fermi-level pinning that occurs at a metal-semiconductor interface may create an energy barrier for electrons by bending the energy bands of the semiconductor material at the interface. The Fermi-level pinning at the metal-semiconductor interface may create a parasitic resistance that degrades electronic device performance. As the Fermi level of metals pins to the valence band edge of the n-type germanium (Ge), electrons have to overcome a significant energy barrier that is substantially equal to the bandgap of Ge to travel from the metal to the n-type Ge. Typically, the height of the energy barrier to transport electrons from the metal to the n-type Ge is in an approximate range from about 0.5 electron volts (eV) to about 0.7 eV. Typically, the resistivity of the conventional metal contacts to the n-type Ge is about $10^{-3}$ ohm*$cm^2$.

Embodiments of the broken bandgap tunneling contact as described herein eliminate the energy barrier for electric current carriers (electrons, holes), so that the contact resistivity is significantly reduced in comparison to the conventional contacts, as described in further detail below. In one embodiment, the contact resistivity of the broken bandgap metal contact described herein is less than $10^{-7}$ ohm*$cm^2$. In more specific embodiment, the contact resistivity of the broken bandgap metal contact described herein is $10^{-9}$ ohm*$cm^2$ or less.

In one embodiment, the interlayer film deposited between the contact layer and the device layer is a semiconductor film, as described in further detail below. In one embodiment, a broken bandgap tunneling contact to an n-type Ge comprises a metal layer on a p-type doped interlayer semiconductor film, as described in further detail below. In one embodiment, the metal contact layer forms an ohmic contact with the semiconductor interlayer film that has a broken bandgap alignment to the device layer, as described in further detail below. In this case, as there is substantially zero resistance to get the carrier from the valence band of the interlayer material into the conduction band of the device layer, the electrical current carriers travel easily in both directions between the device layer and the contact layer by tunneling through the interlayer film, as described in further detail below.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

While certain exemplary embodiments are described and shown in the accompanying drawings, it is to be understood that such embodiments are merely illustrative and not restrictive, and that the embodiments are not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment. Thus, the appearance of the phrases, such as "one embodiment" and "an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment. While the exemplary embodiments have been described herein, those skilled in the art will recognize that these exemplary embodiments can be practiced with modification and alteration as described herein. The description is thus to be regarded as illustrative rather than limiting.

FIG. 1A is a cross-sectional view of an electronic device structure 100 to provide a broken bandgap contact according to one embodiment. A device layer 102 is deposited on a substrate 101, as shown in FIG. 1A. In an embodiment, the substrate 101 comprises a semiconductor material, e.g., silicon (Si). In one embodiment, substrate 101 is a monocrystalline Si substrate. In another embodiment, substrate 101 is a polycrystalline silicon substrate. In yet another embodiment, substrate 101 is an amorphous silicon substrate. In alternative embodiments, substrate 101 includes silicon, germanium ("Ge"), silicon germanium ("SiGe"), a III-V materials based material e.g., gallium arsenide ("GaAs"), or any combination thereof. In one embodiment, substrate 101 comprises a group IV material layer. Generally, the group IV material refers to a semiconductor material comprising one or more elements of the group IV of the periodic table, e.g., carbon (C), silicon (Si), germanium (Ge), tin (Sn), lead (Pb), or any combination thereof. In one embodiment, substrate 101 comprises a germanium layer, a silicon germanium (SiGe) layer, or any combination thereof. In another embodiment, substrate 101 comprises a III-V material layer. Generally, the III-V material refers to a compound semiconductor material that comprises at least one of group III elements of the periodic table, e.g., boron ("B"), aluminum ("Al"), gallium ("Ga"), indium ("In"), and at least one of group V elements of the periodic table, e.g., nitrogen ("N"), phosphorus ("P"), arsenic ("As"), antimony ("Sb"), bismuth ("Bi"). In an embodiment, substrate 101 comprises InP, GaAs, InGaAs, InAlAs, other III-V material, or any combination thereof.

In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In one embodiment, substrate 101 includes one or more metallization interconnect layers for integrated circuits. In at least some embodiments, the substrate 101 includes interconnects, for example, vias, configured to connect the metallization layers. In at least some embodiments, the substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In one embodiment, the substrate includes one or more buffer layers to accommodate for a lattice mismatch between the substrate 101 and one or more layers above substrate 101 and to confine lattice dislocations and defects.

In one embodiment, device layer 102 comprises a semiconductor material. In one embodiment, device layer comprises an n-type doped semiconductor material. In another embodiment, device layer 102 comprises a p-type doped semiconductor material.

In one embodiment, device layer 102 comprises a group IV semiconductor material. In another embodiment, the device layer 102 comprises a III-V material, GaAs, InP, GaP, InGaAs, InAsSb, InGaAs, or other III-V material.

Figure 4A:
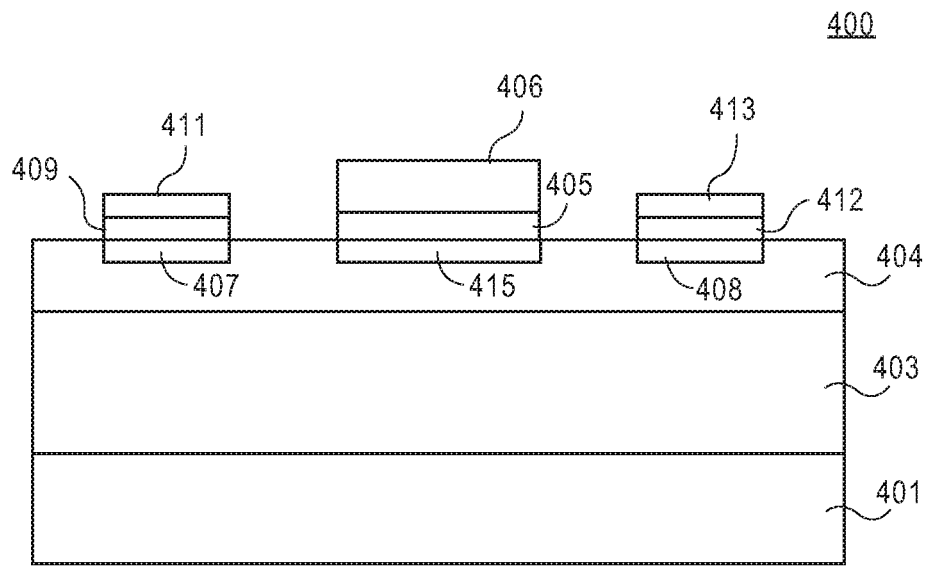
FIG. 4A is a cross-sectional view of the electronic device structure shown in FIG. 5 along an axis A-A' according to one embodiment.
Figure 5:
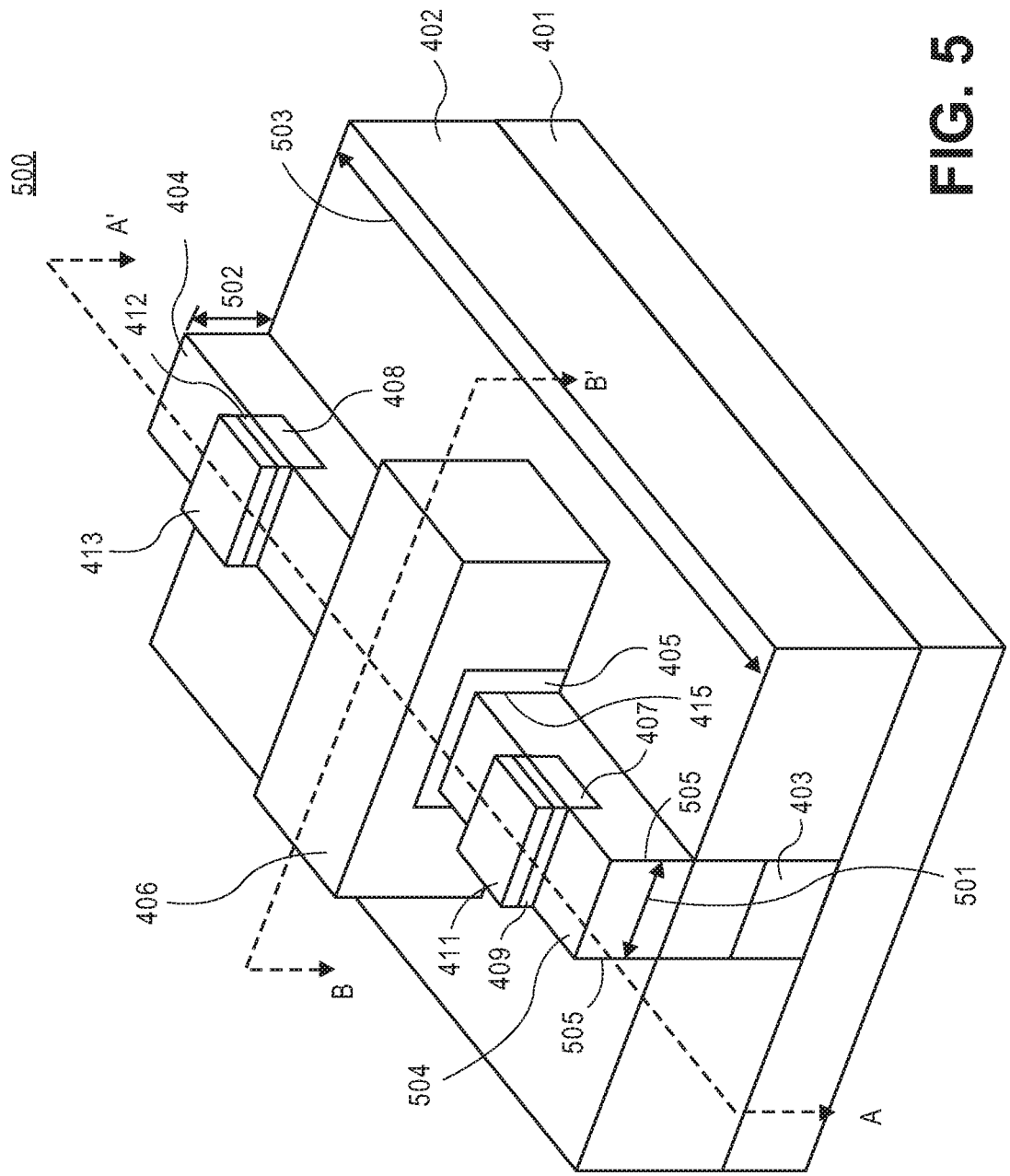
FIG. 5 is a perspective view of the electronic device structure comprising a broken bandgap contact according to one embodiment.

In one embodiment, device layer 102 comprises Si, Ge, SiGe, carbon, other group IV semiconductor material, or any combination thereof. In one embodiment, device layer 102 is an n-type group IV semiconductor. In one embodiment, device layer 102 is an n-type Ge layer. In another embodiment, device layer 102 is an n-type Si layer. In yet another embodiment, device layer 102 is an n-type SiGe layer. In one embodiment, the device layer 102 is a group IV semiconductor having an n-type dopants, e.g., nitrogen (N), phosphorus (P), arsenic (As), antimony (Sb), bismuth (Bi), other n-type dopants, or any combination thereof. In one embodiment, the device layer 102 is a device contact region, or other device region. In one embodiment, the device layer 102 is a transistor source/drain region, or other transistor region. In one embodiment, the dopant concentration in the device layer 102 is at least about $10^{18}$ cm$^{-3}$. In one embodiment, the concentration of the dopants in the device layer 102 is from about $10^{18}$ cm$^{-3}$ to about $10^{22}$ cm$^{-3}$. In one embodiment, device layer 102 represents a source/drain region of the transistor, as shown in FIGS. 4A and 5, or a source/drain region of any other transistor.

In at least some embodiments, device layer 102 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

Figure 1B:
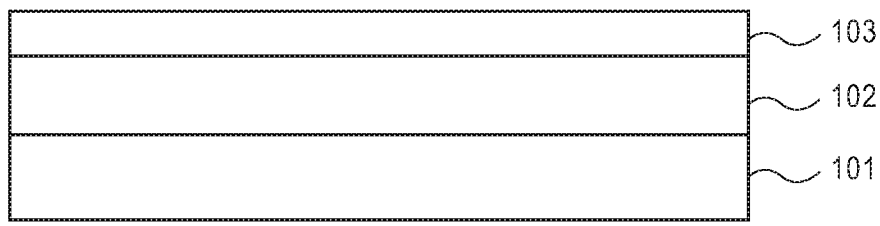
FIG. 1B is a view similar to FIG. 1A after an interlayer film is deposited on the device layer according to one embodiment.

FIG. 1B is a view 110 similar to FIG. 1A after an interlayer film 103 is deposited on device layer 102 according to one embodiment. In one embodiment, the interlayer film 103 has a broken bandgap alignment to the device layer 102, as described in further detail below.

Figure 2:
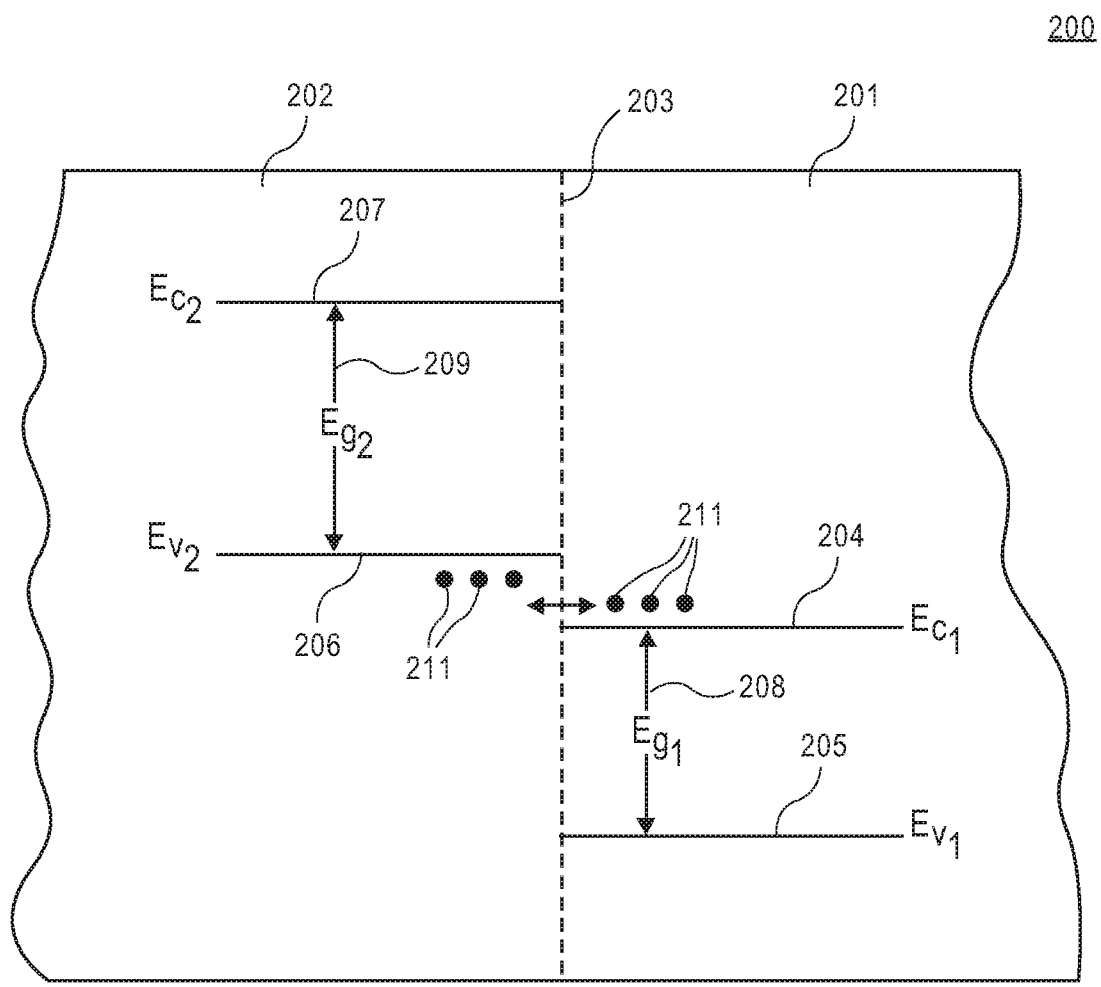
FIG. 2 is a view illustrating an energy band diagram at an interface between a device layer and an interlayer film according to one embodiment.

FIG. 2 is a view 200 illustrating an energy band diagram at an interface 203 between a device layer 201 and an interlayer film 202 according to one embodiment. In one embodiment, device layer 201 represents device layer 102. In one embodiment, interlayer film 202 represents interlayer film 103. Generally, a heterojunction refers to an interface that occurs between two dissimilar materials. In one embodiment, interface 203 is a broken bandgap type heterojunction interface. As shown in FIG. 2, device layer 201 has a conduction energy band $E_{c1}$ 204 and a valence energy band $E_{v1}$ 205 that are separated by a bandgap $Eg_1$ 208. Interlayer film 202 has a conduction energy band $E_{c2}$ 207 and a valence energy band $E_{v2}$ 206 that are separated by a bandgap $Eg_2$ 209. As shown in FIG. 2, the interlayer film 202 has a broken bandgap alignment to the device layer 201, so that at interface 203 the valence band energy $E_{v2}$ 206 is higher than the conduction band energy $E_{c1}$ 204. As shown in FIG. 2, there is no energy barrier for electrical current carriers 211 (e.g., electrons, holes) to travel from the interlayer film 202 to the device layer 201 and from the device layer 201 to the interlayer film 202. In one embodiment, the energy barrier for electrical current carriers 211 is substantially zero. As shown in FIG. 2, the carriers 211 from the valence band 206 go directly to the conduction band 204 and from the conduction band 204 go directly to the valence band 206.

Referring back to FIG. 1B, in one embodiment, the interlayer film 103 is a p-type semiconductor. In another embodiment, interlayer film 103 is an n-type semiconductor. In one embodiment, interlayer film 103 comprises carbon. In one embodiment, the carbon content in the interlayer film 103 is sufficient to have the valence band energy greater than the conduction band energy of the device layer 102.

In one embodiment, interlayer film 103 comprises a group IV semiconductor material. In one embodiment, interlayer film 103 comprises Si, Ge, SiGe, carbon, other semiconductor material, or any combination thereof. In one embodiment, interlayer film 103 is a p-type group IV semiconductor having p-type dopants, e.g., boron (B), aluminum (Al), gallium (Ga), indium (In), thallium (Tl), other p-type dopants, or any combination thereof. In one embodiment, interlayer film 103 is a p-type Ge layer. In another embodiment, interlayer film 103 is a p-type Si layer. In yet another embodiment, interlayer film 103 is a p-type SiGe layer. In one embodiment, interlayer film 103 is a p-type silicon germanium carbon (SiGeC) film. In one embodiment, interlayer film 103 is a p-type silicon germanium carbon (SiGeC) alloy. In more specific embodiment, interlayer film 103 is a boron doped silicon germanium carbon (SiGeC) having at least 3 weight percent (wt %) of carbon. In another embodiment, the interlayer film 103 comprises a III-V material, GaAs, InP, GaP, InGaAs, InAsSb, InGaAs, or other III-V material.

In one embodiment, interlayer film 103 has the dopant concentration of at least about $10^{19}$ cm$^{-3}$. In more specific embodiment, the concentration of the dopants in the interlayer film 103 is in an approximate range from at least about $10^{19}$ cm$^{-3}$ to about $10^{22}$ cm$^{-3}$.

In one embodiment, the interlayer film 103 is thin enough so that the interlayer does not add a significant resistance for the carriers (electrons, holes) that travel from the contact layer 104 to device layer 102. In one embodiment, the thickness of the interlayer film 103 is less than about 5 nanometers (nm). In one embodiment, the thickness of the interlayer film 103 is in an approximate range from about 0.5 nm to about 20 nm.

In at least some embodiments, interlayer film 103 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

Figure 1C:
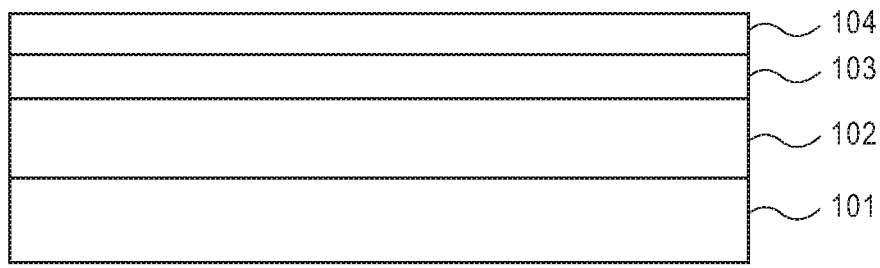
FIG. 1C is a view similar to FIG. 1B after a contact layer is deposited on the interlayer film according to one embodiment.

FIG. 1C is a view 120 similar to FIG. 1B after a contact layer 104 is deposited on the interlayer film 103 according to one embodiment. In one embodiment, a Fermi level of the contact layer 104 pins to the valence band of the interlayer film 103, as described in further detail below.

Figure 3:
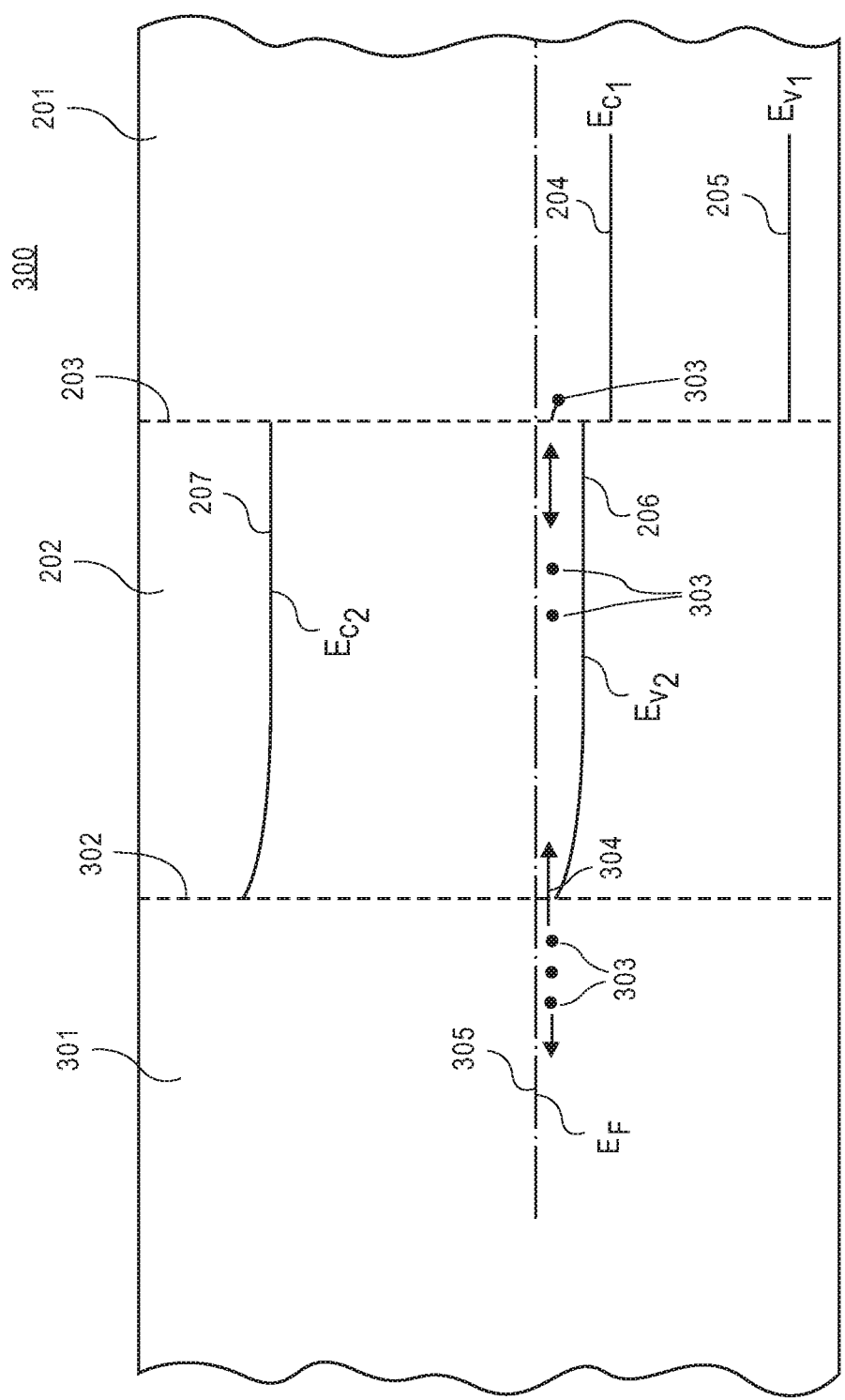
FIG. 3 is a view illustrating an energy band diagram at an interface between a contact layer and the interlayer film on the device layer according to one embodiment.

FIG. 3 is a view 300 illustrating an energy band diagram for a broken bandgap contact comprising a contact layer 301 on interlayer film 202 on device layer 203 according to one embodiment. In one embodiment, contact layer 301 represents contact layer 104.

As shown in FIG. 3, a Fermi level 305 of the contact layer 301 pins to valence energy band $E_{v2}$ 206 to form an ohmic contact with the interlayer film 202. In one embodiment, Fermi level 305 pins to valence energy band $E_{v2}$ 206 so that a distance between the Fermi level 305 and conduction energy band $E_{c2}$ 207 is greater than a distance between Fermi level 305 and valence energy band $E_{v2}$ 206. Generally, an ohmic contact refers to a junction between two materials that has a linear current-voltage (I-V) curve according to an Ohm's law. As shown in FIG. 3, there is no energy barrier for electrical current carriers 303 (e.g., electrons, holes) to travel from the contact layer 301 through interlayer film 202 to the device layer 201 and from the device layer 201 to the interlayer film 202.

Referring back to FIG. 1C, in one embodiment, contact layer 104 is a metal layer e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, other metal layer, or any combination thereof.

In alternative embodiments, examples of the conductive materials that may be used for the contact layer are, but not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof. In one embodiment, the thickness of the contact layer 104 is from about 1 nm to about 500 nm.

In an embodiment, the contact layer 104 is deposited using one of deposition techniques, such as but not limited to a CVD, PVD, MBE, MOCVD, ALD, spin-on, electroless, electro-plating, or other deposition techniques known to one of ordinary skill in the art of microelectronic device manufacturing.

Figure 4B:
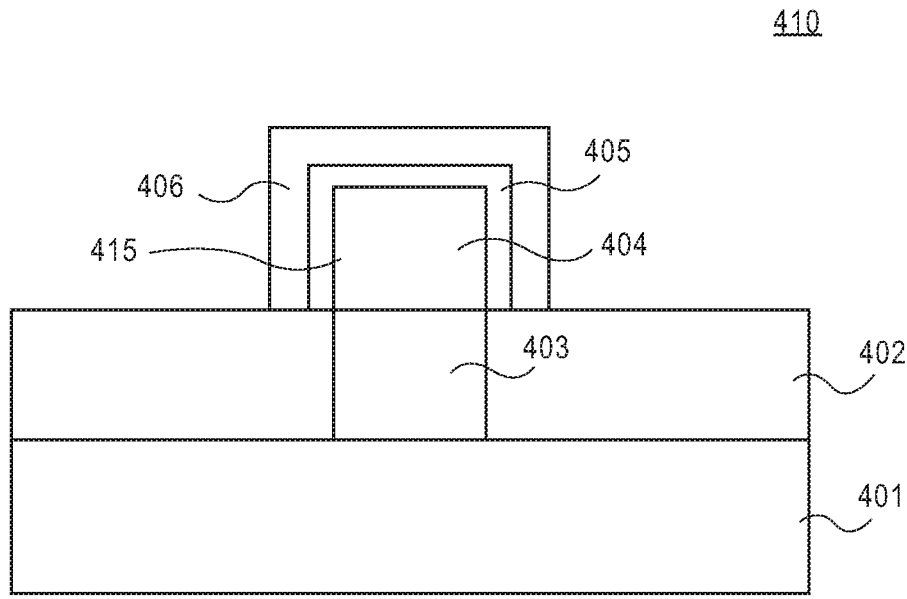
FIG. 4B is a cross-sectional view of the electronic device structure shown in FIG. 5 along an axis B-B' according to one embodiment.

FIG. 5 is a perspective view of the electronic device structure 500 comprising a broken bandgap contact according to one embodiment. FIG. 4A is a cross-sectional view 400 of the electronic device structure shown in FIG. 5 along an axis A-A' according to one embodiment. FIG. 4B is a cross-sectional view 410 of the electronic device structure shown in FIG. 5 along an axis B-B' according to one embodiment. As shown in FIGS. 4A, 4B and 5, a device layer 404 is deposited on a buffer layer 403 on a substrate 401. In one embodiment, substrate 401 represents one of the substrates described above. In one embodiment, buffer layer 403 represents one of the buffer layers described above.

An insulating layer 402 is deposited on the substrate 401. Insulating layer 402 can be any material suitable to insulate adjacent devices and prevent leakage. In one embodiment, electrically Insulating layer 402 is an oxide layer, e.g., silicon dioxide, or any other electrically insulating layer determined by an electronic device design. In one embodiment, insulating layer 402 comprises an interlayer dielectric (ILD). In one embodiment, insulating layer 402 is a low-k dielectric that includes, but is not limited to, materials such as, e.g., silicon dioxide, silicon oxide, carbon doped oxide ("CDO"), e.g., carbon doped silicon dioxide, porous silicon dioxide, silicon nitride, or any combination thereof. In one embodiment, insulating layer 402 includes a dielectric material having k-value less than 5. In one embodiment, insulating layer 402 includes a dielectric material having k-value less than 2. In at least some embodiments, insulating layer 402 includes a nitride, oxide, a polymer, phosphosilicate glass, fluorosilicate (SiOF) glass, organosilicate glass (SiOCH), other electrically insulating layer determined by an electronic device design, or any combination thereof. In at least some embodiments, Insulating layer 402 may include polyimide, epoxy, photodefinable materials, such as benzocyclobutene (BCB), and WPR-series materials, or spin-on-glass.

In one embodiment, insulating layer 402, is a shallow trench isolation (STI) layer to provide field isolation regions that isolate one fin from other fins on substrate 401. In one embodiment, the thickness of the insulating layer 402 is at least 10 nm. In one embodiment, the thickness of the layer is in an approximate range from about 10 nm to about 2 microns (μm).

In an embodiment, insulating layer 402 is deposited on substrate 401 using one of deposition techniques, such as but not limited to a chemical vapour deposition ("CVD"), a physical vapour deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

As shown in FIGS. 4A, 4B and 5, device layer 404 is a fin having a top portion 505, and opposing sidewalls 505. In one embodiment, buffer layer 403 comprises a subfin underneath the device layer fin 404. As shown in FIGS. 4A, 4B and 5, the device layer 404 has a channel region 415 and source/drain regions, such as a source region 407 and a drain region 408. In one embodiment, each of the source/drain regions 407 and 408 is represented by device layer 102.

As shown in FIGS. 4A and 5, an interlayer film 409 is deposited on the source region 407. An interlayer film 412 is deposited on the drain region 408. In one embodiment, each of the interlayer films 409 and 412 represents one of the interlayer films described above. In one embodiment, the valence band energy of the interlayer film is greater than or equal to the conduction band energy of the source/drain region, as described above. A contact layer 411 is deposited on the interlayer film 409. A contact layer 413 is deposited on interlayer film 412. In one embodiment, each of the contact layers 411 and 413 represents one of the contact layers described above. In one embodiment, the contact layer pins to the valence band of the interlayer film, as described above.

As shown in FIGS. 4A, 4B and 5, device layer fin 404 protrudes from a top surface of insulating layer 402. Device layer fin 404 has a width 501, height 502 and a length 503. Length 503 is substantially greater than the width 501, as shown in FIG. 5. The height and the width of the fin are typically determined by a design. In an embodiment, the height 502 is from about 5 nm to about 100 nm and the width 501 is from about 5 nm to about 30 nm. In one embodiment, device layer fin 404 is formed using patterning and etching techniques known to one of ordinary skill in the art of microelectronic device manufacturing.

In one embodiment, device layer 404 is a semiconductor material layer. In one embodiment, device layer 404 comprises an n-type doped semiconductor material. In one embodiment, device layer 404 comprises a p-type doped semiconductor material. In one embodiment, device layer 404 comprises an intrinsic semiconductor material.

In one embodiment, device layer 404 is a group IV semiconductor material. In another embodiment, the device layer 404 is a III-V material, GaAs, InP, GaP, InGaAs, InAsSb, InGaAs, other III-V material, or any combination thereof.

In one embodiment, device layer 404 is Si, Ge, SiGe, carbon, other group IV semiconductor material, or any combination thereof. In one embodiment, each of the source/drain regions of the device layer 404 comprises an n-type group IV semiconductor. In one embodiment, each of the source/drain regions of the device layer 404 comprises an n-type Ge layer. In another embodiment, each of the source/drain regions of the device layer 404 comprises an n-type Si layer. In yet another embodiment, each of the source/drain regions of the device layer 404 comprises an n-type SiGe layer. In one embodiment, each of the source/drain regions of the device layer 404 comprises a group IV semiconductor having an n-type dopants, e.g., nitrogen (N), phosphorus (P), arsenic (As), antimony (Sb), bismuth (Bi), other n-type dopants, or any combination thereof.

In one embodiment, the dopant concentration in each of the source/drain regions of the device layer 404 is at least about $10^{18}$ cm$^{-3}$. In one embodiment, the concentration of the dopants in each of the source/drain regions of the device layer 404 is from about $10^{18}$ cm$^{-3}$ to about $10^{22}$ cm$^{-3}$. In one embodiment, each of the interlayer films 409 and 412 comprises carbon. In one embodiment, each of the interlayer films 409 and 412 is a silicon germanium carbon film. In one embodiment, each of the interlayer films 409 and 412 has a dopant concentration of at least $10^{19}$ cm$^{-3}$.

In at least some embodiments, device layer 404 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

In at least some embodiments, the interlayer film is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

In an embodiment, the contact layer 104 is deposited using one of deposition techniques, such as but not limited to a CVD, PVD, MBE, MOCVD, ALD, spin-on, electroless, electro-plating, or other deposition techniques known to one of ordinary skill in the art of microelectronic device manufacturing.

As shown in FIGS. 4A, 4B and 5, a gate dielectric layer 405 is deposited on top portion 504 and opposing sidewalls 505 of a portion of the device layer fin 404 to form channel region 415. A gate electrode layer 406 is deposited on gate dielectric layer 405. In one embodiment, gate dielectric layer 405 is a high-k dielectric material having a dielectric constant greater than the dielectric constant of silicon dioxide. In one embodiment, gate dielectric layer 405 comprises a high-k dielectric material, such as a metal oxide dielectric. For example, gate dielectric layer 405 can be but not limited to tantalum silicon oxide (TaSiOx); pentaoxide (Ta$_2$O$_5$), and titanium oxide (TiO$_2$) zirconium oxide (ZrO$_2$), hafnium oxide (HfO$_2$), lanthanum oxide (La$_2$O$_4$), lead zirconium titanate (PZT), other high-k dielectric material, or a combination thereof. In an embodiment, the gate dielectric layer 405 is a silicon dioxide (SiO$_2$), silicon oxynitride (SiO$_x$N$_y$) or a silicon nitride (Si$_3$N$_4$) dielectric layer. In an embodiment, the thickness of the gate dielectric layer 405 is in an approximate range from about 1 nm to about 20 nm, and more specifically, between about 5 nm to about 10 nm.

As shown in FIGS. 4A, 4B and 5, gate electrode layer 406 is formed on and around the gate dielectric layer 405. As shown in FIGS. 4A, 4B and 5, gate electrode layer 406 has a top portion and laterally opposite sidewalls separated by a distance which defines the length of the channel 415 of the fin based transistor device. Gate electrode 406 can be formed of any suitable gate electrode material. In an embodiment, the gate electrode 406 is a metal gate electrode, such as but not limited to, tungsten, tantalum, titanium, and their nitrides. It is to be appreciated, the gate electrode 406 need not necessarily be a single material and can be a composite stack of thin films, such as but not limited to a polycrystalline silicon/metal electrode or a metal/polycrystalline silicon electrode.

In at least some embodiments, the gate dielectric layer 405 is deposited using one of gate dielectric layer deposition techniques, such as but not limited to a chemical vapour deposition ("CVD"), a physical vapour deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing. In at least some embodiments, the gate electrode layer 406 is deposited using one of gate electrode deposition techniques known to one of ordinary skill in the art of microelectronic device manufacturing.

Source region 407 and drain region 408 are formed at opposite sides of the gate electrode 406 in a device layer fin 404, as shown in FIGS. 4A and 5. The source and drain regions are formed of the same conductivity type such as N-type or P-type conductivity. In an embodiment, the source and drain regions have a doping concentration of between $1\times10^{19}$ and $1\times10^{21}$ atoms/cm$^3$. The source and drain regions can be formed of uniform concentration or can include sub-regions of different concentrations or doping profiles such as tip regions (e.g., source/drain extensions). In an embodiment, the source and drain regions have the same doping concentration and profile. In an embodiment, the doping concentration and profile of the source and drain regions, such as source region 407 and drain region 408 can vary in to obtain a particular electrical characteristic.

The portion of the device layer 404 located between the source region 407 and drain region 408, defines channel region 415 of the transistor. The channel region can also be defined as the area of the fin 404 surrounded by the gate electrode 406. At times however, the source/drain region may extend slightly beneath the gate electrode through, for example, diffusion to define a channel region slightly smaller than the gate electrode length (Lg). In an embodiment, the channel region is intrinsic or undoped. In an embodiment, the channel region is doped, for example to a conductivity level of between $1\times10^{16}$ to $1\times10^{19}$ atoms/cm$^3$. In an embodiment, when the channel region is doped it is typically doped to the opposite conductivity type of the source/drain region. For example, when the source and drain regions are N-type conductivity the channel region would be doped to a p type conductivity. Similarly, when the source and drain regions are P type conductivity the channel region would be N-type conductivity. In this manner a tri-gate transistor can be formed into either a NMOS transistor or a PMOS transistor respectively.

Channel regions can be uniformly doped or can be doped non-uniformly or with differing concentrations to provide particular electrical and performance characteristics. For example channel regions can include halo regions, if desired. As shown in FIGS. 4A, 4B and 5, the tri-gate transistor has gate dielectric 405 and gate electrode 406 surrounding the device layer fin 404 on three sides that provides three channels on the fin 404, one channel extends between the source and drain regions on one sidewall of the fin, a second channel extends between the source and drain regions on the top surface of the fin, and the third channel extends between the source and drain regions on the other sidewall of the fin.

In an embodiment, the source region 407 is electrically coupled to higher levels of metallization (e.g., metal 1, metal 2, metal 3, and so on) to electrically interconnect various transistors of the array into functional circuits using the broken bandgap contact comprising the interlayer film 409. In one embodiment, the drain region 408 is coupled to higher levels of metallization (e.g., metal 1, metal 2, metal 3, and so on) to electrically interconnect various transistors of the array together into functional circuits using the broken bandgap contact comprising the interlayer film 412.

Figure 6:
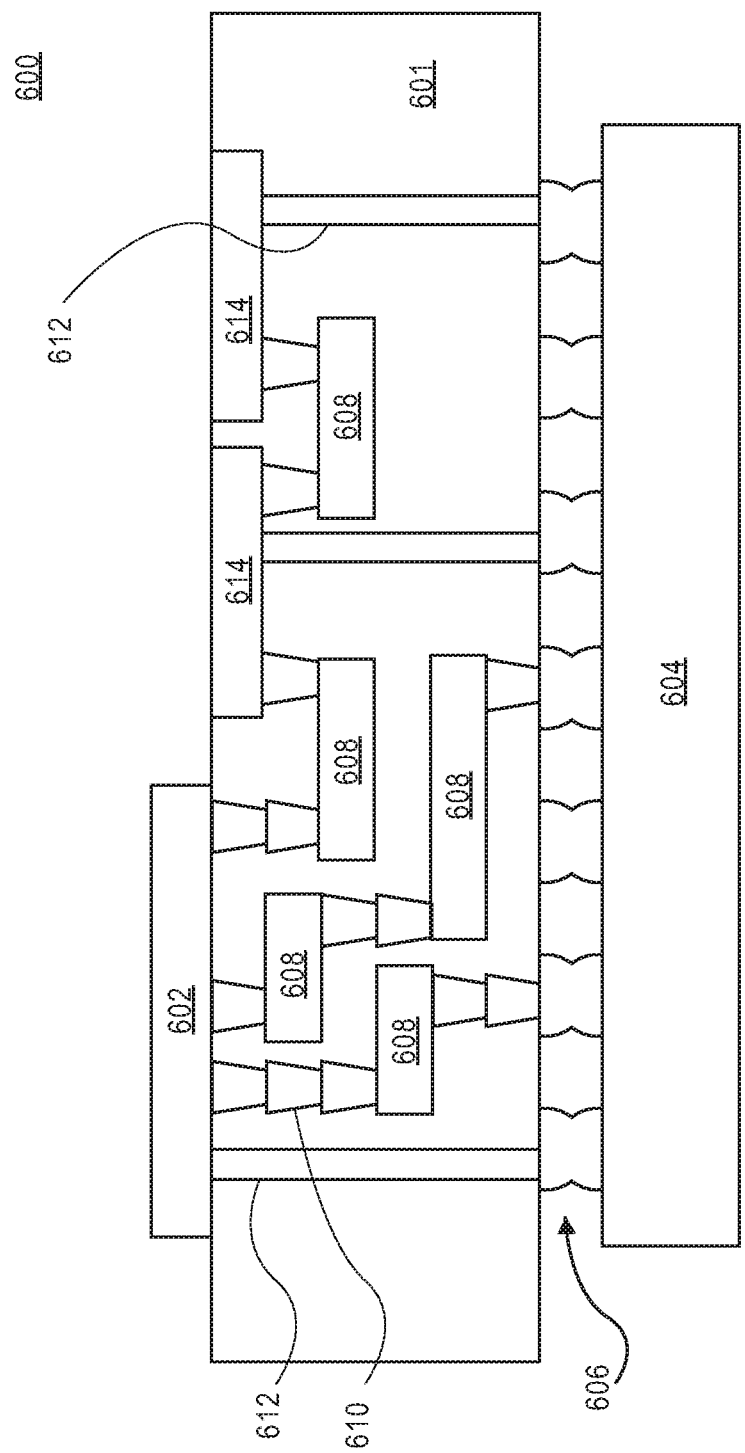
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die that includes transistors, diodes, or other semiconductor based devices having broken bandgap contacts, as described herein. The second substrate 604 may be, for instance, a memory module, a computer motherboard, or another integrated circuit die that includes transistors, diodes, or other semiconductor based devices having broken bandgap contacts, as described herein.

Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608, vias 610 and through-silicon vias (TSVs) 612. The interposer 600 may further include embedded devices 614, including passive and active devices that include broken bandgap contacts as described herein. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Figure 7:
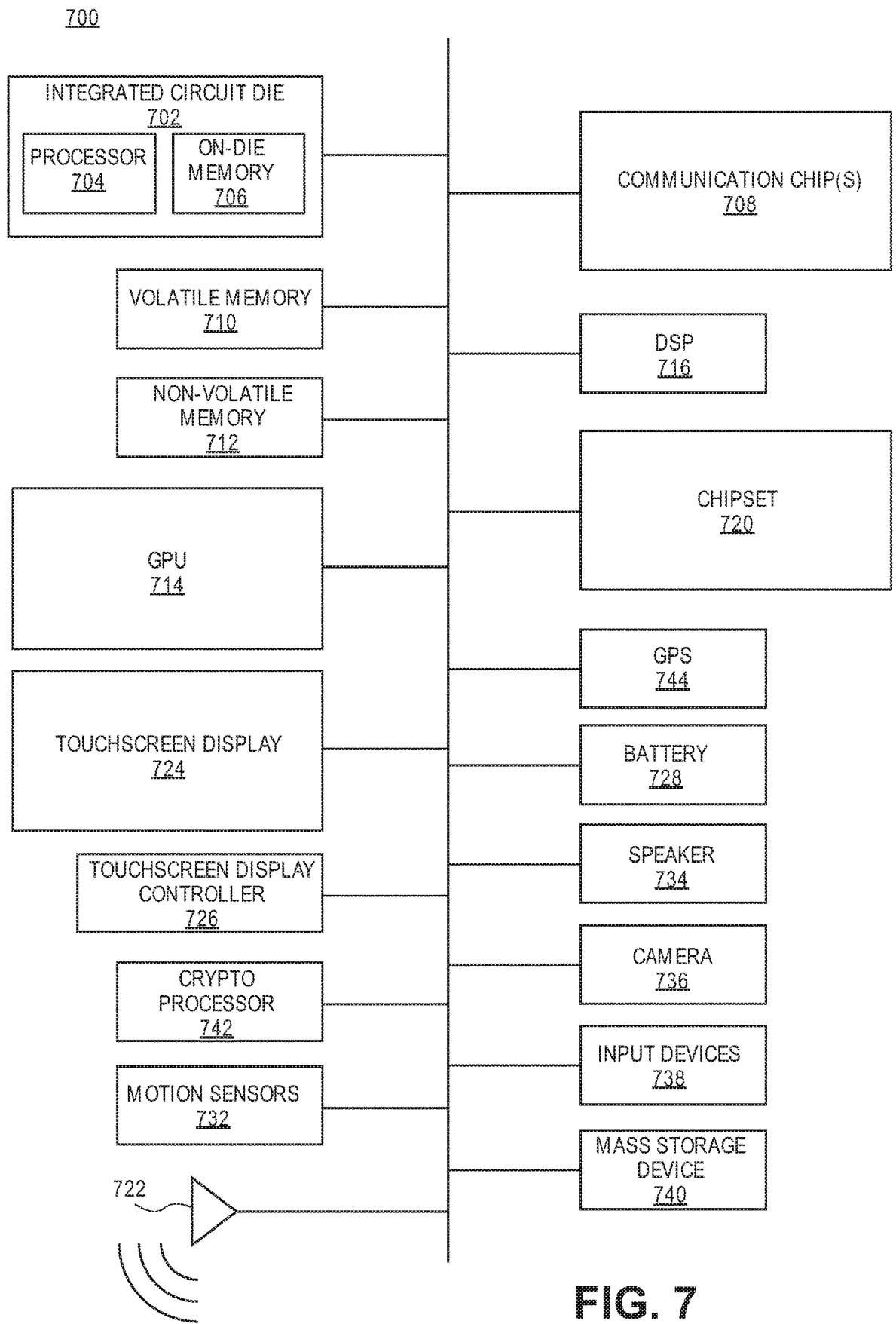
FIG. 7 illustrates a computing device in accordance with one embodiment of the invention.

FIG. 7 illustrates a computing device 700 in accordance with one embodiment of the invention. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a processor 704 such as a central processing unit (CPU), an on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, a volatile memory 710 (e.g., DRAM), a non-volatile memory 712 (e.g., ROM or flash memory), a graphics processing unit 714 (GPU), a digital signal processor 716 (DSP), a crypto processor 742 (a specialized processor that executes cryptographic algorithms within hardware), a chipset 720, an antenna 722, a display or a touchscreen display 724, a touchscreen display controller 726, a battery 728 or other power source, a global positioning system (GPS) device 744, a power amplifier (PA), a compass, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communication chip 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi and Bluetooth and a second communication chip 708 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. One or more components (e.g., integrated circuit die 702, communication chip 708, GPU 714, cryptoprocessor 742, DSP 716, chipset 720), and other components may include one or more broken bandgap contacts formed in accordance with embodiments of the invention. In further embodiments, another component housed within the computing device 700 may contain one or more broken bandgap contacts formed in accordance with embodiments of the invention.

In various embodiments, the computing device 700 may be a laptop computer, a netbook computer, a notebook computer, an ultrabook computer, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

The above description of illustrative implementations of the invention, including what is described in the Abstract, is not intended to be exhaustive or to limit the invention to the precise forms disclosed. While specific implementations of, and examples for the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The following examples pertain to further embodiments:

In Example 1, an electronic device comprises an interlayer film on a device layer on a substrate; a contact layer on the interlayer film, wherein a valence band energy of the interlayer film is greater than or equal to a conduction band energy of the device layer.

In Example 2, the subject matter of Example 1 can optionally include that that a Fermi level of the contact layer pins to the valence band of the interlayer film.

In Example 3, the subject matter of any of Examples 1-2 can optionally include that the interlayer film is a p-type doped semiconductor.

In Example 4, the subject matter of any of Examples 1-3 can optionally include that the device layer is an n-type doped semiconductor.

In Example 5, the subject matter of any of Examples 1-4 can optionally include that the device layer comprises an NMOS germanium source/drain region.

In Example 6, the subject matter of any of Examples 1-5 can optionally include that the interlayer film comprises carbon.

In Example 7, the subject matter of any of Examples 1-6 can optionally include that the interlayer film is a film selected from the group consisting of a silicon, a germanium, a silicon germanium, a silicon germanium carbon and a boron doped silicon germanium carbon.

In Example 8, the subject matter of any of Examples 1-7 can optionally include that the contact layer is a metal layer.

In Example 9, the subject matter of any of Examples 1-8 can optionally include a gate dielectric layer on a channel portion of the device layer; and a gate electrode on the gate dielectric layer, wherein the interlayer film is deposited on a source/drain region of the device layer.

In Example 10, the subject matter of any of Examples 1-9 can optionally include that the interlayer film has a dopant concentration of at least $10^{19}$ cm$^{-3}$. In Example 11, a computing system comprises a chip including an electronic device comprising an interlayer film on a device layer on a substrate; and a contact layer on the interlayer film, wherein a valence band energy of the interlayer film is greater than or equal to a conduction band energy of the device layer.

In Example 12, the subject matter of Example 11 can optionally include that a Fermi level of the contact layer pins to the valence band of the interlayer film.

In Example 13, the subject matter of any of Examples 11-12 can optionally include that, the device layer comprises an n-type semiconductor.

In Example 14, the subject matter of any of Examples 11-13 can optionally include that the device layer comprises a germanium layer.

In Example 15, the subject matter of any of Examples 11-14 can optionally include that the interlayer film comprises carbon.

In Example 16, the subject matter of any of Examples 11-15 can optionally include that the interlayer film is a film selected from the group consisting of a silicon, a germanium, a silicon germanium, a silicon germanium carbon and a boron doped silicon germanium carbon.

In Example 17, the subject matter of any of Examples 11-16 can optionally include that the interlayer film has a dopant concentration at least $10^{19}$ cm$^{-3}$.

In Example 18, a method to manufacture an electronic device comprises depositing an interlayer film on a device layer on a substrate; depositing a contact layer on the interlayer film, wherein a valence band energy of the interlayer film is greater than or equal to a conduction band energy of the device layer.

In Example 19, the subject matter of Example 18 can optionally include that a Fermi level of the contact layer pins to the valence band of the interlayer film.

In Example 20, the subject matter of any of Examples 18-19 can optionally include that the interlayer film is a p-type doped semiconductor.

In Example 21, the subject matter of any of Examples 18-20 can optionally include that the device layer is an n-type doped semiconductor.

In Example 22, the subject matter of any of Examples 18-21 can optionally include that the interlayer film comprises carbon.

In Example 23, the subject matter of any of Examples 18-22 can optionally include that the interlayer film is a film selected from the group consisting of a silicon, a germanium, a silicon germanium, a silicon germanium carbon and a boron doped silicon germanium carbon.

In Example 24, the subject matter of any of Examples 18-23 can optionally include depositing a gate dielectric layer on a channel portion of a device layer, and depositing a gate electrode on the gate dielectric layer, wherein the interlayer film is deposited on a source/drain region of the device layer.

In Example 25, the subject matter of any of Examples 18-24 can optionally include that the interlayer film has a dopant concentration of at least $10^{19}$ cm$^{-3}$.

In Example 26, a method to manufacture a transistor comprises depositing a device layer on a substrate; depositing a gate dielectric layer on a channel region of the device layer; depositing an interlayer film on a source/drain region of the device layer; and depositing a contact layer on the interlayer film, wherein a valence band energy of the interlayer film is greater than or equal to a conduction band energy of the source/drain region.

In Example 27, the subject matter of any of Examples 18-26 can optionally include that a Fermi level of the contact layer pins to the valence band of the interlayer film.

In Example 28, the subject matter of any of Examples 18-27 can optionally include that the source/drain region comprises an n-type semiconductor.

In Example 29, the subject matter of any of Examples 18-28 can optionally include that the source/drain region comprises a germanium layer.

In Example 30, the subject matter of any of Examples 18-29 can optionally include that interlayer film comprises carbon.

In Example 31, the subject matter of any of Examples 26-30 can optionally include that the interlayer film is film selected from the group consisting of a silicon, a germanium, a silicon germanium, a silicon germanium carbon and a boron doped silicon germanium carbon.

In Example 32, the subject matter of any of Examples 26-31 can optionally include that the interlayer film has a dopant concentration of at least $10^{19}$ cm$^{-3}$.

In Example 33, an electronic device comprises an interlayer film on a device layer on a substrate; a contact layer on the interlayer film, wherein the interlayer film is a film selected from the group consisting of a silicon, a germanium, a silicon germanium, a silicon germanium carbon and a boron doped silicon germanium carbon.

In Example 34, the subject matter of Example 33 can optionally include that the interlayer film has a valence band energy greater than or equal to a conduction band energy of the device layer.

In Example 35, the subject matter of any of Examples 32-34 can optionally include that a Fermi level of the contact layer pins to the valence band of the interlayer film.

In Example 36, the subject matter of any of Examples 32-35 can optionally include that the interlayer film is a p-type doped semiconductor.

In Example 37, the subject matter of any of Examples 32-36 can optionally include that the device layer is an n-type doped semiconductor.

In Example 38, the subject matter of any of Examples 32-37 can optionally include that the device layer comprises an NMOS germanium source/drain region.

In Example 39, the subject matter of any of Examples 32-38 can optionally include a gate dielectric layer on a channel portion of the device layer; and a gate electrode on the gate dielectric layer, wherein the interlayer film is deposited on a source/drain region of the device layer.

In Example 40, the subject matter of any of Examples 32-39 can optionally include that the interlayer film has a dopant concentration of at least $10^{19}$ $cm^{-3}$.

In the foregoing specification, methods and apparatuses have been described with reference to specific exemplary embodiments thereof. It will be evident that various modifications may be made thereto without departing from the broader spirit and scope of embodiments as set forth in the following claims. The specification and drawings are, accordingly, to be regarded in an illustrative sense rather than a restrictive sense.

What is claimed is:

1. An electronic device comprising:
   a gate electrode above a device layer, the device layer above a substrate, wherein the device layer is a P-type device layer, the P-type device layer comprising germanium;
   an interlayer film on a portion of the device layer, wherein the interlayer film is not vertically beneath the gate electrode;
   a contact layer on the interlayer film, the interlayer film having a broken bandgap alignment to the device layer to reduce a contact resistance of the contact layer to the device layer, wherein a valence band energy of the interlayer film is higher than a conduction band energy of the device layer at an interface between the interlayer film and the device layer.

2. The electronic device of claim 1, wherein the contact layer pins to the valence band of the interlayer film.

3. The electronic device of claim 1, wherein the interlayer film comprises carbon.

4. The electronic device of claim 1, wherein the contact layer is a metal layer.

5. The electronic device of claim 1, further comprising
   a gate dielectric layer on a channel portion of the device layer; and
   the gate electrode on the gate dielectric layer, wherein the interlayer film is deposited on a source/drain region of the device layer.

6. An electronic device comprising:
   a gate electrode above a device layer above a substrate, the device layer comprising germanium, and the device layer comprising an N-type source region and an N-type drain region;
   a P-type interlayer film on the N-type source region and on the N-type drain region, the P-type interlayer film comprising silicon, germanium and carbon; and
   a contact layer on the interlayer film.

7. The electronic device of claim 6, wherein the interlayer film has a broken bandgap alignment to the N-type source region and the N-type drain region to reduce a contact resistance of the contact layer to the N-type source region and the N-type drain region, wherein a valence band energy of the interlayer film is higher than a conduction band energy of the device layer at an interface between the interlayer film and the N-type source region and the N-type drain region.

8. The electronic device of claim 6, wherein the device layer further comprises silicon.

9. The electronic device of claim 6, wherein the contact layer is a metal layer.

10. The electronic device of claim 6, further comprising
    a gate dielectric layer on a channel portion of the device layer; and
    a gate electrode on the gate dielectric layer, wherein the interlayer film is deposited on a source/drain region of the device layer.

* * * * *